US009269655B2

(12) United States Patent
Cho et al.

(10) Patent No.: US 9,269,655 B2
(45) Date of Patent: Feb. 23, 2016

(54) METHOD FOR FABRICATING A SEMICONDUCTOR PACKAGE WITH CONDUCTIVE CARRIER INTEGRATED HEAT SPREADER

(71) Applicant: International Rectifier Corporation, El Segundo, CA (US)

(72) Inventors: Eung San Cho, Torrance, CA (US); Andrew N. Sawle, East Grinstead (GB); Mark Pavier, Felbridge (GB); Daniel Cutler, Betchworth (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/825,382

(22) Filed: Aug. 13, 2015

(65) Prior Publication Data

US 2015/0348887 A1    Dec. 3, 2015

Related U.S. Application Data

(62) Division of application No. 14/022,584, filed on Sep. 10, 2013, now Pat. No. 9,111,921.

(60) Provisional application No. 61/715,737, filed on Oct. 18, 2012.

(51) Int. Cl.
| | |
|---|---|
| H01L 21/44 | (2006.01) |
| H01L 21/48 | (2006.01) |
| H01L 21/50 | (2006.01) |
| H01L 23/495 | (2006.01) |
| H01L 25/00 | (2006.01) |
| H01L 25/07 | (2006.01) |
| H01L 23/00 | (2006.01) |

(52) U.S. Cl.
CPC .... *H01L 23/49568* (2013.01); *H01L 23/49562* (2013.01); *H01L 23/49575* (2013.01); *H01L 24/83* (2013.01); *H01L 25/072* (2013.01); *H01L 25/50* (2013.01); *H01L 2924/1033* (2013.01); *H01L 2924/10253* (2013.01); *H01L 2924/10323* (2013.01); *H01L 2924/10325* (2013.01); *H01L 2924/10334* (2013.01); *H01L 2924/10341* (2013.01); *H01L 2924/10344* (2013.01); *H01L 2924/10346* (2013.01); *H01L 2924/10355* (2013.01); *H01L 2924/10356* (2013.01); *H01L2924/10357* (2013.01); *H01L 2924/10358* (2013.01); *H01L 2924/1306* (2013.01)

(58) Field of Classification Search
CPC ............... H01L 23/49575; H01L 23/49562; H01L 25/072; H01L 23/49568; H01L 24/83; H01L 25/50
USPC .................................................. 438/107, 122
See application file for complete search history.

(56) References Cited

U.S. PATENT DOCUMENTS

| | | | |
|---|---|---|---|
| 2012/0181624 A1* | 7/2012 | Cho | ............... H01L 23/49524 257/401 |
| 2012/0181674 A1* | 7/2012 | Cho | ....................... H01L 24/34 257/666 |
| 2012/0292753 A1 | 11/2012 | Cho | |

*Primary Examiner* — Thien F Tran
(74) *Attorney, Agent, or Firm* — Farjami & Farjami LLP

(57) ABSTRACT

In one implementation, a semiconductor package includes a control conductive carrier having a die side and an opposite input/output (I/O) side connecting the semiconductor package to a mounting surface. The semiconductor package also includes a control FET of a power converter switching stage having a control drain attached to the die side of the control conductive carrier. The control conductive carrier is configured to sink heat produced by the control FET into the mounting surface. The semiconductor package includes a sync conductive carrier having another die side and another opposite I/O side connecting the semiconductor package to the mounting surface, and a sync FET of the power converter switching stage having a sync source attached to the die side of the sync conductive carrier.

20 Claims, 8 Drawing Sheets

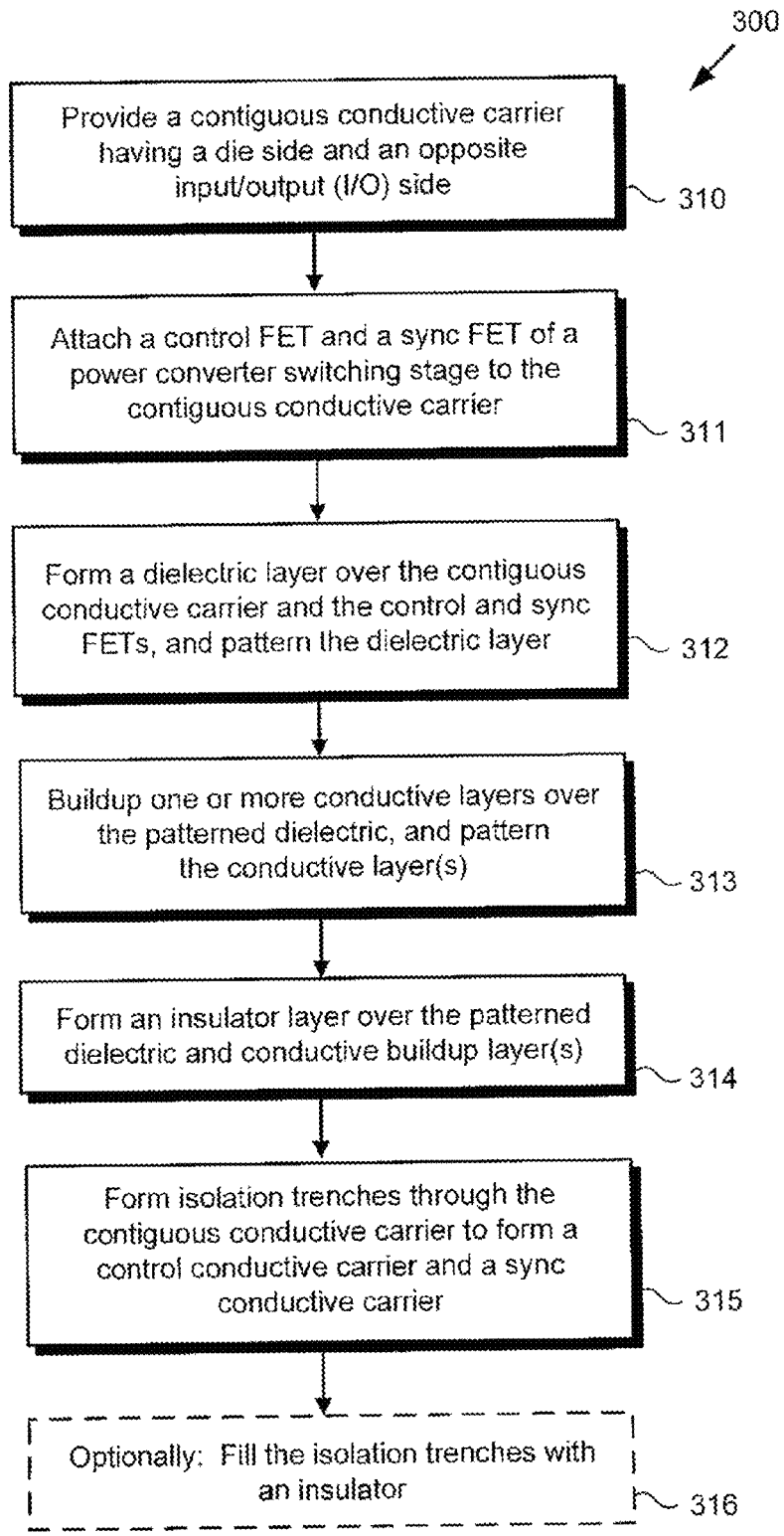

US 9,269,655 B2

METHOD FOR FABRICATING A SEMICONDUCTOR PACKAGE WITH CONDUCTIVE CARRIER INTEGRATED HEAT SPREADER

This is a divisional of application Ser. No. 14/022,584 filed Sep. 10, 2013, which itself claims benefit of and priority to U.S. Provisional Patent Application Ser. No. 61/715,737, filed Oct. 18, 2012. The disclosures in the above-identified patent applications are hereby incorporated fully by reference into the present application.

BACKGROUND

Background Art

Power converters are used in a variety of electronic circuits and systems. Many integrated circuit (IC) applications, for instance, require conversion of a direct current (DC) input to a lower, or higher, DC output. For example, a synchronous buck converter may be implemented as a voltage regulator to convert a higher voltage DC input to a lower voltage DC output for use in low voltage applications in which relatively large output currents are required.

The voltage converted output of a synchronous buck converter is typically provided by a power switching stage including a high side control switch and a low side synchronous (sync) switch capable of generating substantial heat during operation. That potentially damaging heat may be diverted away from the power switches using a heat spreader, which, in order to remove the heat generated by the control and sync power switches is often relatively large. Consequently, packaging solutions for such power converters must typically be sized to accommodate not only the control and sync switches of the power converter switching stage, but a relatively large heat spreader providing thermal protection for those power switches as well.

SUMMARY

The present disclosure is directed to a semiconductor package with a conductive carrier integrated heat spreader, substantially as shown in and/or described in connection with at least one of the figures, and as set forth more completely in the claims.

BRIEF DESCRIPTION OF THE DRAWINGS

FIG. 3 shows a flowchart presenting one exemplary method for fabricating a semiconductor package with a conductive carrier integrated heat spreader.

DETAILED DESCRIPTION

Figure 1:
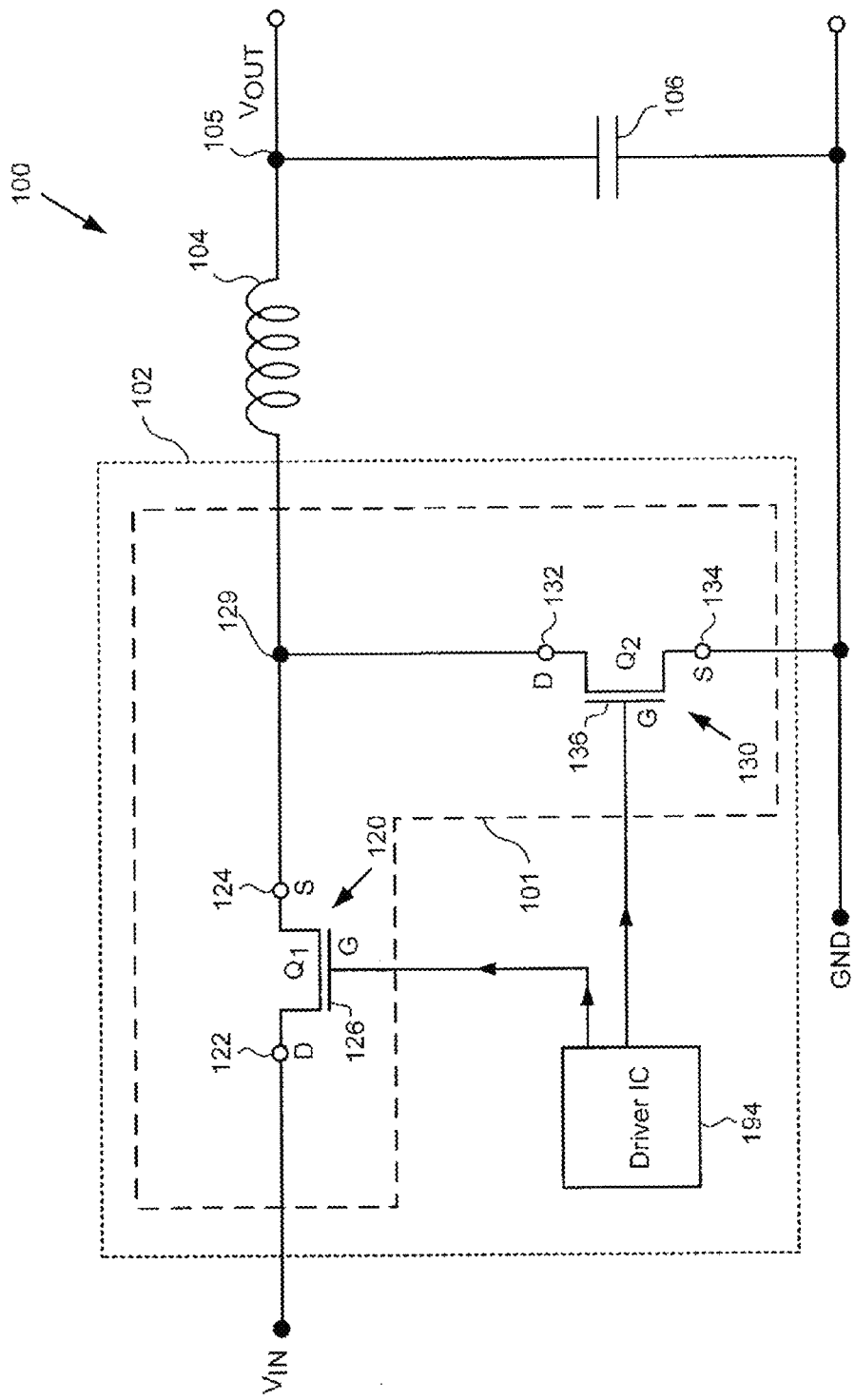
FIG. 1 shows a diagram of an exemplary power converter circuit.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, power converters such as voltage regulators are used in a variety of electronic circuits and systems. For instance, and as noted above, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1 shows a diagram of an exemplary power converter circuit. Power converter 100 includes power converter multichip module (MCM) 102, output inductor 104, and output capacitor 106. As shown in FIG. 1, MCM 102 includes switching stage 101 of power converter 100, and driver IC 194 implemented to provide drive signals to switching stage 101. As shown in FIG. 1, power converter 100 is configured to receive an input voltage $V_{IN}$, and to provide a converted voltage, e.g., a rectified and/or stepped down voltage, as $V_{OUT}$ at output 105.

Switching stage 101 may be implemented using two power switches in the form of metal-oxide-semiconductor field-effect transistors (MOSFETs) configured as a half bridge, for example. That is to say, switching stage 101 may include high side or control switch 120 ($Q_1$) having control drain 122, control source 124, and control gate 126, as well as low side or sync switch 130 ($Q_2$) having sync drain 132, sync source 134, and sync gate 136. Control switch 120 is coupled with sync switch 130 at switch node 129, which, in turn, is coupled to output 105 through output inductor 104. Respective control and sync switches 120 and 130 may be implemented as group IV based power devices, such as silicon power MOSFETs having a vertical design, for example. Power converter 100 may be advantageously utilized as a voltage converter, for example a buck converter, in a variety of automotive, industrial, appliance, and lighting applications.

It is noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV material based, or group III-V semiconductor based, power transistors. It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

As noted above, power switches, such as control and sync switches 120 and 130, are capable of generating substantial heat during operation. As further noted above, that potentially damaging heat can be diverted away from control and sync switches 120 and 130 using a heat spreader, which is often relatively large. In addition, the connection between control switch 120 and sync switch 130 providing switch node 129 is typically implemented using a conductive clip, such as a copper clip, which must be sufficiently robust to accommodate high current. Moreover, because control switch 120 and sync switch 130 can be highly sensitive to electrical resistance, the cross-sectional area of the conductive clip used to provide switch node 129 may also be relatively large. Consequently, packaging solutions for switching stage 101 and/or MCM 102 must typically be sized to accommodate not only control and sync switches 120 and 130, but a large heat spreader providing thermal protection for those power switches and a large conductive clip for their connection as well.

Figure 2:
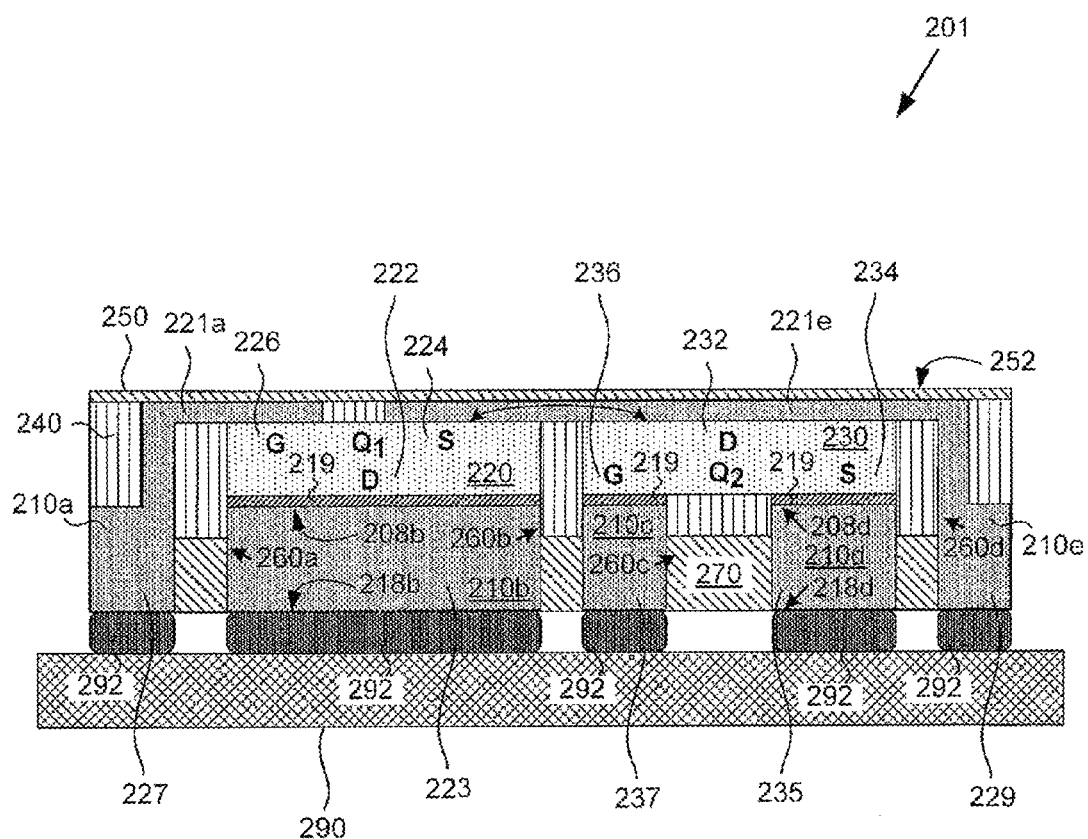
FIG. 2 shows a cross-sectional view of an exemplary semiconductor package with a conductive carrier integrated heat spreader, according to one implementation.

The present application discloses a packaging solution enabling omission of the aforementioned heat spreader and switch node conductive clip, while concurrently providing thermal protection for control and sync switches 120 and 130, and also providing a reliable, low resistance, and substantially parasitic free electrical connection for establishing switch node 129. In one implementation, a control conductive carrier and a sync conductive carrier utilized as structural supports in the packaging solution, such as portions of a conductive lead frame for example, are configured to provide integrated heat spreading. In addition, the support structure used to provide the control conductive carrier and the sync conductive carrier can also be used to provide switch node 129. FIG. 2 shows an exemplary representation of such a packaging solution.

FIG. 2 shows a cross-sectional view of semiconductor package 201 attached to mounting surface 290, which may be a printed circuit board (PCB) for example, by solder bodies 292. Semiconductor package 201 includes control conductive carrier 210$b$ having die side 208$b$ and opposite input/output (I/O) side 218$b$ connecting semiconductor package 201 to mounting surface 290. Semiconductor package 201 also includes sync conductive carrier 210$d$ having die side 208$d$ and opposite I/O side 218$d$ also connecting semiconductor package 201 to mounting surface 290.

Semiconductor package 201 further includes control FET 220 ($Q_1$) having control drain 222, control source 224, and control gate 226, as well as sync FET 230 ($Q_2$) having sync drain 232, sync source 234, and sync gate 236. As shown in FIG. 2, control drain 222 of control FET 220 is attached to die side 208$b$ of control conductive carrier 210$b$, and sync source 234 of sync FET 230 is attached to die side 208$d$ of sync conductive carrier 210$d$. Semiconductor package 201 also includes conductive carrier section 210$a$ including conductive carrier buildup region 221$a$, conductive carrier section 210$c$ attached to sync gate 236, and conductive carrier section 210$e$ including conductive carrier buildup region 221$e$. In addition, semiconductor package 201 includes electrically conductive die attach material 219, patterned dielectric 240, insulator 270 filling isolation trenches 260$a$, 260$b$, 260$c$, and 260$d$ (hereinafter "isolation trenches 260$a$-260$d$"), and insulator layer 250 providing surface 252.

Also included as part of semiconductor package 201 are drain contact 223 provided by control conductive carrier 210$b$, source contact 235 provided by sync conductive carrier 210$d$, gate contacts 227 and 237 provided by respective conductive carrier sections 210$a$ and 210$c$, and switch node contact 229 provided by conductive carrier section 210$e$. It is noted that in addition to providing drain contact 223, conductive carrier 210$b$ is configured to sink heat produced by control FET 220 into mounting surface 290. Moreover, in addition to providing source contact 235, conductive carrier 210$d$ is configured to sink heat produced by sync FET 230 into mounting surface 290. It is further noted that conductive carrier section 210$e$ is configured to provide switch node contact 229, as well as to provide integrated heat spreading functionality for dissipation of heat generated by control and sync FETs 220 and 230.

Semiconductor package 201 corresponds in general to switching stage 101 in FIG. 1. In addition, control FET 220 having control drain 222, control source 224, and control gate 226, and sync FET 230 having sync drain 232, sync source 234, and sync gate 236, correspond in general to control switch 120 having control drain 122, control source 124, and control gate 126, and sync switch 130 having sync drain 132, sync source 134, and sync gate 136, respectively, in FIG. 1. Moreover, switch node contact 229, in FIG. 2, corresponds to switch node 129, in FIG. 1.

The features of semiconductor package 201 will be described in greater detail by reference to FIG. 3, and FIGS. 4A, 4B, 4C, 4D, 4E, 4F, and 4G (hereinafter "FIGS. 4A-4G"). However, it is noted in reference to FIG. 2 that the electrical connection between control source 224 of control FET 220 and sync drain 232 of sync FET 230 is established in the absence of a conductive clip or other feature implemented solely or primarily as an electrical connector. Instead, according to the implementation shown in FIG. 2, the electrical connection between control source 224 and sync drain 232 establishing switch node contact 229 is advantageously provided by conductive carrier section 210$e$, which includes conductive buildup region 221$e$. As a result, the packaging solution of FIG. 2 provides a robust, low resistance, and low parasitic connection for providing switch node contact 229. Moreover, the inventive concepts disclosed by the packaging solution represented in FIG. 2 can be extended to enable the fabrication of high density MCM packages, with reduced parasitics and improved thermal performance.

Referring to FIG. 3, FIG. 3 shows flowchart 300 presenting an exemplary method for fabricating a semiconductor package with a conductive carrier integrated heat spreader. It is noted that the method described by flowchart 300 is performed on a portion of a conductive carrier structure, which may be a semiconductor package lead frame, or may take the form of a conductive sheet or plate, for example.

Figure 4A:
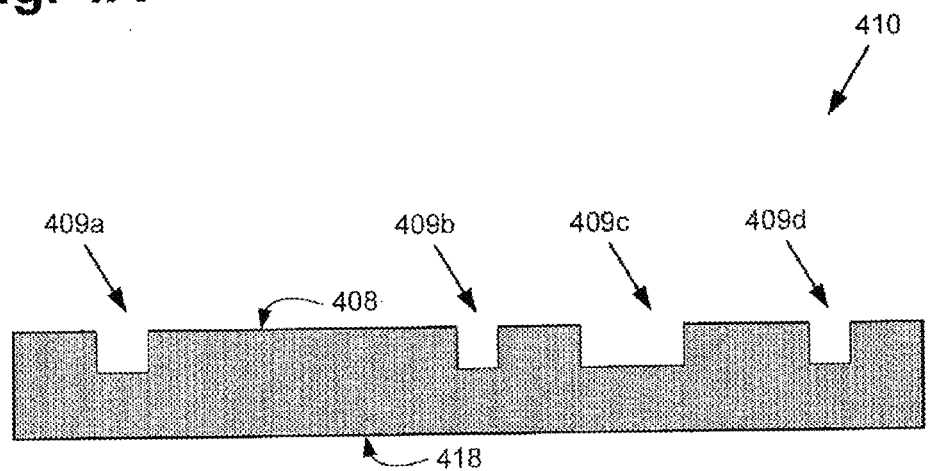
FIG. 4A shows an exemplary structure corresponding to an initial stage of the method described in FIG. 3.

With respect to FIGS. 4A-4G, structures 410 through 416 shown respectively in those figures illustrate the result of performing the method of flowchart 300 on an initially contiguous conductive carrier. For example, FIG. 4A represents contiguous conductive carrier 410 before processing (310), structure 411 shows contiguous conductive carrier 410 after attachment to a control FET and a sync FET (311), structure 412 shows structure 411 after the formation and patterning of a dielectric layer (312), and so forth. It is noted that contiguous conductive carrier 410, in FIGS. 4A through 4E, corresponds in general to, and serves as a foundational structure for, control conductive carrier 210b, sync conductive carrier 210d, and conductive carrier sections 210a, 210c and 210e, in FIG. 2.

Referring to flowchart 300, in FIG. 3, in combination with FIG. 4A, flowchart 300 begins with providing contiguous conductive carrier 410 having die side 408 and opposite I/O side 418 (310). As shown in FIG. 4A, contiguous conductive carrier 410 is represented as a pre-patterned conductive sheet or plate having die side 408, I/O side 418, and cavities 409a, 409b, 409c, and 409d (hereinafter "cavities 409a-409d") pre-patterned on die side 408. Contiguous conductive carrier 410 may be formed of any conductive material having a suitably low electrical resistance. Examples of materials from which contiguous conductive carrier 410 may be formed include copper (Cu), aluminum (Al), or a conductive alloy. In one implementation, contiguous conductive carrier 410 may be implemented using a semiconductor package lead frame. It is noted that die side 408 of contiguous conductive carrier 410 corresponds in general to die sides 208b and 208d of respective control and sync conductive carriers 210b and 210d, in FIG. 2. It is further noted that I/O side 418 of contiguous conductive carrier 410 corresponds in general to I/O sides 218b and 218d of respective control and sync conductive carriers 210b and 210d, in FIG. 2.

Although the present exemplary implementation shows contiguous conductive carrier 410 as a pre-patterned sheet or plate including cavities 409a-409d on die side 408, in other implementations, contiguous conductive carrier 410 may be pre-patterned to have more, or fewer, cavities than cavities 409a-409d on die side 408. Furthermore, although the present exemplary implementation shows contiguous conductive carrier 410 as a pre-patterned sheet or plate, that need not always be the case. For example, in other implementations, an unpatterned conductive sheet or plate from which cavities 409a-409d are omitted may be used as contiguous conductive carrier 410.

Moreover, although not shown in the present figures, in some implementations, contiguous conductive carrier 410, whether pre-patterned or unpatterned, may include a barrier metal layer formed on one or both of die side 408 and I/O side 418. Such a barrier metal layer may be formed of nickel-gold (NiAu) or nickel-palladium-gold (NiPdAu), for example. In some implementations, such a barrier metal layer may serve as an etching mask during patterning or pre-patterning of contiguous conductive carrier 410. Thereafter, such a barrier metal layer can provide a solderable surface at one or both of die side 408 and I/O side 418 of contiguous conductive carrier 410.

Figure 4B:
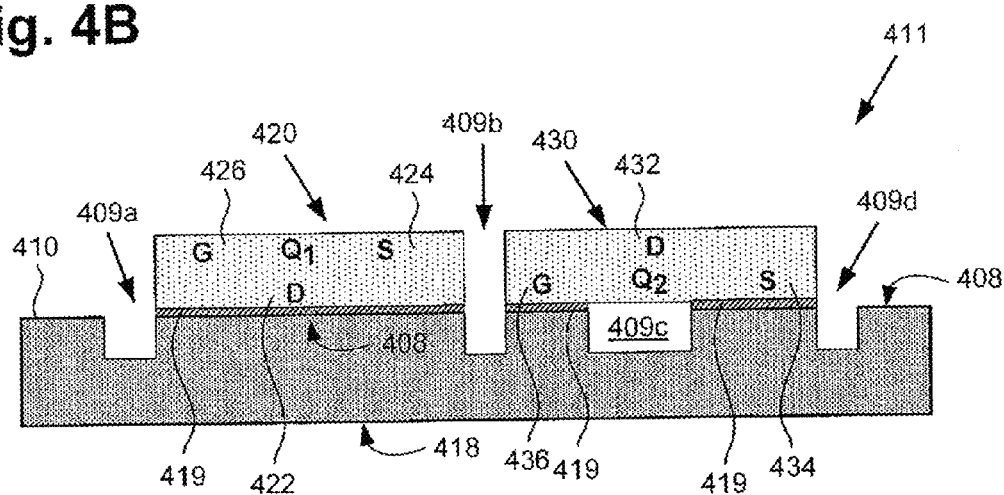
FIG. 4B shows the exemplary structure in FIG. 4A at an intermediate stage of the method described in FIG. 3.

Moving to structure 411 in FIG. 4B with ongoing reference to FIG. 3, flowchart 300 continues with attaching control FET 420 ($Q_1$) and sync FET 430 ($Q_2$) to contiguous conductive carrier 410 (311). Control FET 420 includes control drain 422, control source 424, and control gate 426, while sync FET 430 includes sync drain 432, sync source 434, and sync gate 436. As shown in FIG. 4B, control FET 420 and sync FET 430 are attached to die side 408 of contiguous conductive carrier 410 by electrically conductive die attach material 419.

Electrically conductive die attach material 419 may be any suitable substance, such as a conductive epoxy, solder, a conductive sintered material, or diffusion bonded material formed to a thickness of from approximately 0.5 mm to approximately 2.0 mm, for example. Control FET 420 and sync FET 430 are shown as power FETs having a vertical topology. That is to say, control source 424 and control gate 426 are situated on the same side of control FET 420, while control drain 422 is situated on an opposite side of control FET 420. Similarly, sync source 434 and sync gate 436 are situated on the same side of sync FET 430, while sync drain 432 is situated on an opposite side of sync FET 430.

In one implementation, respective control and sync FETs 420 and 430 may take the form of group IV material based vertical FETs, such as silicon vertical MOSFETs for example. However, in other implementations, respective control and sync FETs 420 and 430 may take the form of group III-V based power FETs, such as GaN or other III-Nitride based FETs.

It is noted that control FET 420 and sync FET 430 are flipped relative to each other. That is to say, control FET 420 is disposed on contiguous conductive carrier 410 in a "face up" orientation in which control drain 422 is attached to die side 408 of contiguous conductive carrier 410, while sync FET 430 is oriented "face down" such that sync source 434 and sync gate 436 are attached to die side 408 of contiguous conductive carrier 410. Moreover, and as shown in FIG. 4B, sync FET 430 is disposed over cavity 409c such that cavity 409c is situated between the attachment of sync source 434 to die side 408 of contiguous conductive carrier 410 and the attachment of sync gate 436 to die side 408 of contiguous conductive carrier 410. Control FET 420, sync FET 430, and electrically conductive die attach material 419 correspond respectively to control FET 220, sync FET 230, and electrically conductive die attach material 219, in FIG. 2.

Figure 4C:
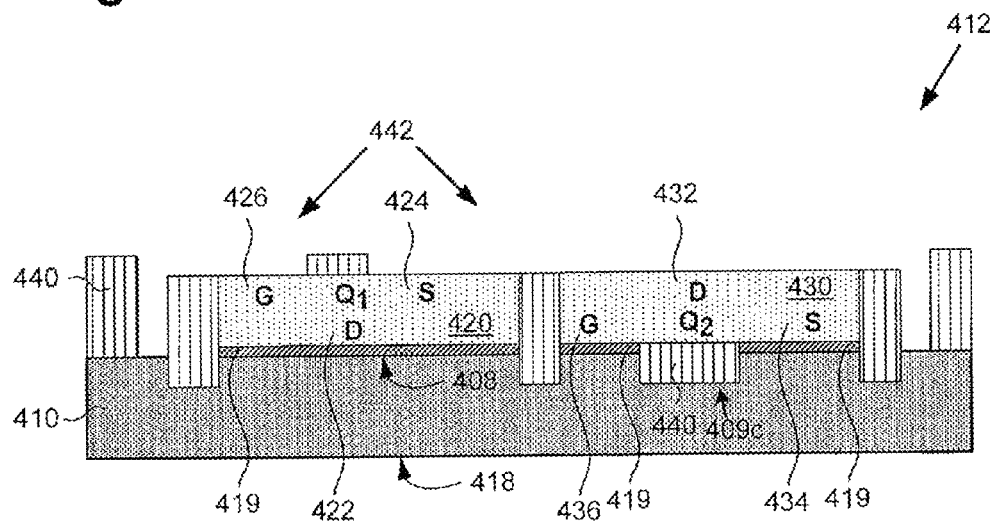
FIG. 4C shows the exemplary structure in FIG. 4B at another intermediate stage of the method described in FIG. 3.

As shown by structure 412 in FIG. 4C, flowchart 300 continues with forming a dielectric layer over contiguous conductive carrier 410, control FET 420, and sync FET 430, followed by patterning of the dielectric layer to form patterned dielectric 440 (312). Patterned dielectric 440 may be formed by initially laminating a pre-formed dielectric layer onto contiguous conductive carrier 410, control FET 420, and sync FET 430, and then patterning the pre-formed dielectric layer to produce windows 442. Such a pre-formed dielectric layer may be cut or otherwise patterned from a pre-formable dielectric material, such as an epoxy-phenolic or cyanate ester-epoxy build-up material, for example, or any other preformable dielectric utilized in laminate substrate technology. In one implementation, for example, patterned dielectric 440 may be formed of a B-stage polymeric material cured during lamination. As a result, pre-formed dielectric 440 can substantially fill cavity 409c, as shown in FIG. 4C.

Patterning of the dielectric layer to form patterned dielectric 440 including windows 442 can be performed using any known technique, such as etching. Patterned dielectric 442 includes windows 442 exposing die side 408 of contiguous conductive carrier 410 adjacent each of control FET 420 and sync FET 430, as well as exposing control source 424, control gate 426, and sync drain 432. Patterned dielectric 440 corresponds to patterned dielectric 240, in FIG. 2.

Figure 4D:
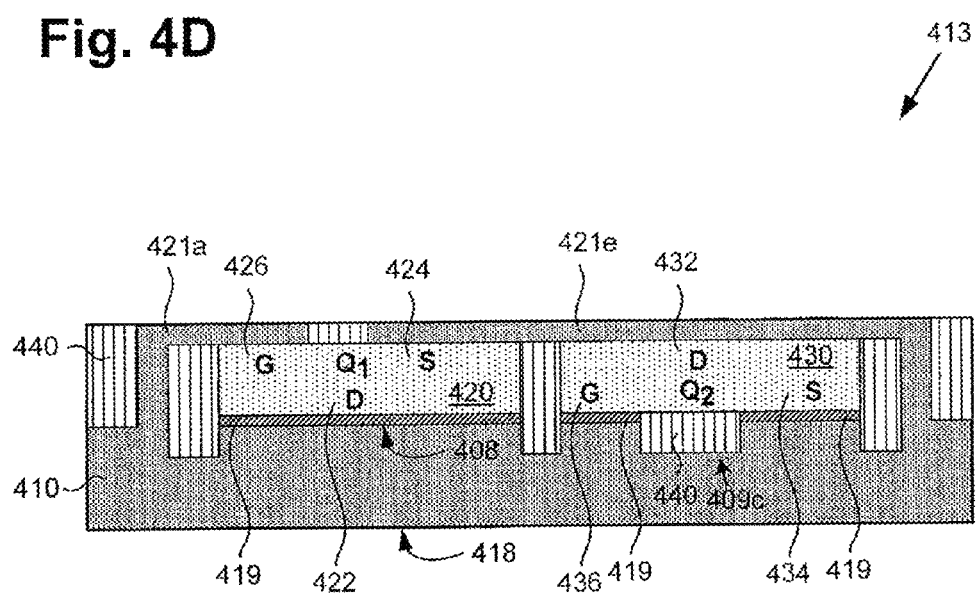
FIG. 4D shows the exemplary structure in FIG. 4C at another intermediate stage of the method described in FIG. 3.

Moving to structure 413 in FIG. 4D, flowchart 300 continues with buildup of one or more conductive layers over patterned dielectric 440, and patterning of the conductive layer(s) to form conductive carrier buildup regions 421a and 421e (313). The conductive layer(s) may be formed of Cu or Al, for example, or may be formed from a metal alloy, such as a metal alloy including Cu and Ni, for example. Such conductive layer or layers may be built up using any suitable technique, such as electrochemical deposition or an electrolytic plating process, for example. After buildup, the conductive layer or layers are patterned to form conductive carrier buildup regions 421a and 421e. Conductive carrier buildup regions 421a and 421e correspond respectively to conductive carrier buildup regions 221a and 221e, in FIG. 2.

Figure 4E:
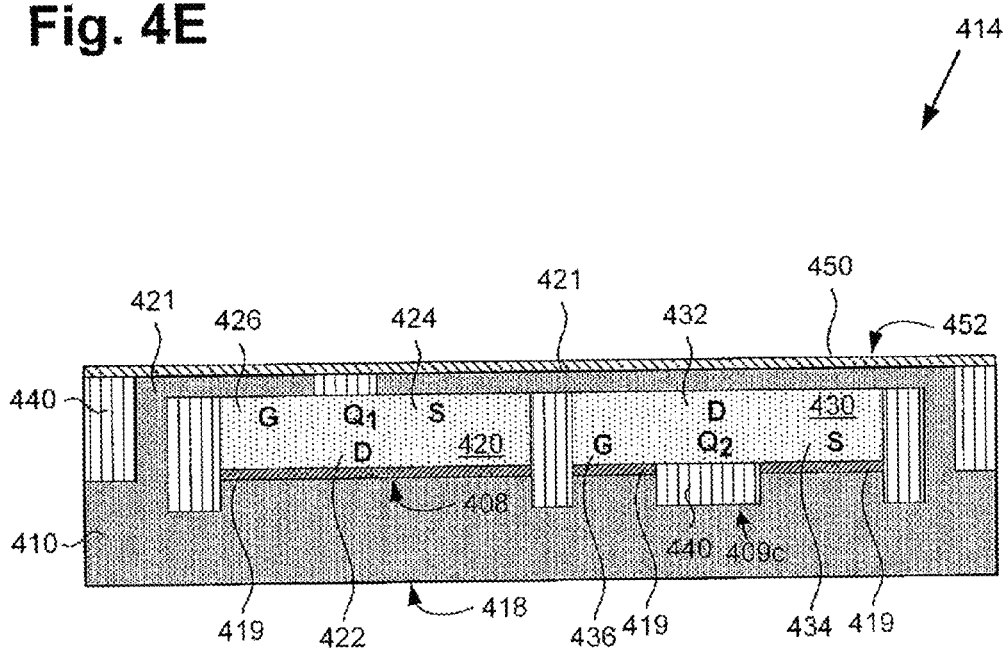
FIG. 4E shows the exemplary structure in FIG. 4D at another intermediate stage of the method described in FIG. 3.

Continuing to structure 414 in FIG. 4E, flowchart 300 continues with forming insulator layer 450 over patterned dielectric 440 and conductive carrier buildup regions 421*a* and 421*e* (314). Insulator layer 450 may be formed as a blanket layer of solder resist, for example, which provides surface 452. Insulator layer 450 providing surface 452 corresponds to insulator layer 250 providing surface 252, in FIG. 2.

Figure 4F:
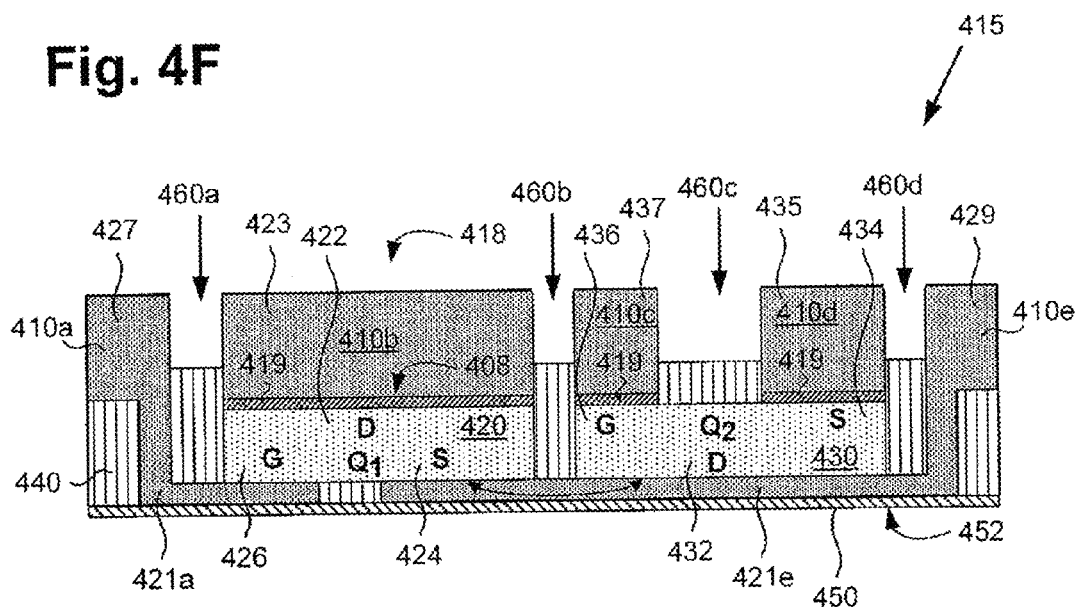
FIG. 4F shows the exemplary structure in FIG. 4E at another intermediate stage of the method described in FIG. 3.

Moving to structure 415 in FIG. 4F, flowchart 300 may conclude with formation of isolation trenches 460*a*, 460*b*, 460*c*, and 460*d* (hereinafter "isolation trenches 460*a*-460*d*") through contiguous conductive carrier 410 (315). As shown in FIG. 4F, isolation trenches 460*a*-460*d* are formed at I/O side 418 of contiguous conductive carrier 410 and extend from I/O side 418 to the patterned dielectric formed in cavities 409*a*-409*d* on die side 408. Moreover, in some implementations, as further shown in FIG. 4F, one or more of isolation trenches 460*a*-460*d* may be substantially aligned with respective cavities 409*a*-409*d*.

Isolation trenches 460*a*-460*d* may be formed using any suitable technique, such as etching, or laser ablation, for example, as known in the art. Formation of isolation trenches 460*a*-460*d* results in formation of control conductive carrier 410*b*, sync conductive carrier 410*d*, and conductive carrier sections 410*a*, 410*c*, and 410*e*, from contiguous conductive carrier 410. Thus, in implementations in which contiguous conductive carrier 410 is a semiconductor package lead frame, control conductive carrier 410*b* and sync conductive carrier 410*d*, as well as conductive carrier sections 410*a*, 410*c*, and 410*e*, may each include a portion of such a lead frame.

Formation of isolation trenches 460*a*-460*d* also results in electrical isolation of each of control conductive carrier 410*b*, sync conductive carrier 410*d*, and conductive carrier sections 410*a*, 410*c*, and 410*e* from the others. Isolation trenches 460*a*-460*d*, control conductive carrier 410*b*, sync conductive carrier 410*d*, and conductive carrier sections 410*a*, 410*c*, and 410*e* correspond respectively to isolation trenches 260*a*-260*d*, control conductive carrier 210*b*, sync conductive carrier 210*d*, and conductive carrier sections 210*a*, 210*c*, and 210*e*, in FIG. 2.

It is noted that conductive carrier section 410*e* including conductive carrier buildup region 421*e* electrically connects control source 424 of control FET 420 to sync drain 432 of sync FET 430. In addition, conductive carrier section 410*e* provides switch node contact 429. It is further noted that although in the present exemplary implementation, isolation trenches 460*a*-460*d* extend from I/O side 418 to patterned dielectric 440 within cavities 409*a*-409*d*, that attribute results from use of a pre-patterned contiguous conductive carrier as contiguous conductive carrier 410. In implementations in which an unpatterned conductive carrier is used, cavity 409 and its dielectric fill would be absent, and isolation trenches 460*a*-460*d* could be formed so as to extend from I/O side 418, through contiguous conductive carrier 410, to die side 408. In those implementations, isolation trench 460*c* could be formed through contiguous conductive carrier 410 so as to form a gap between the attachment of sync source 434 to die side 408 and the attachment of sync gate 436 to die side 408, thereby electrically isolating conductive carrier section 410*c* from sync conductive carrier 410*d*.

Figure 4G:
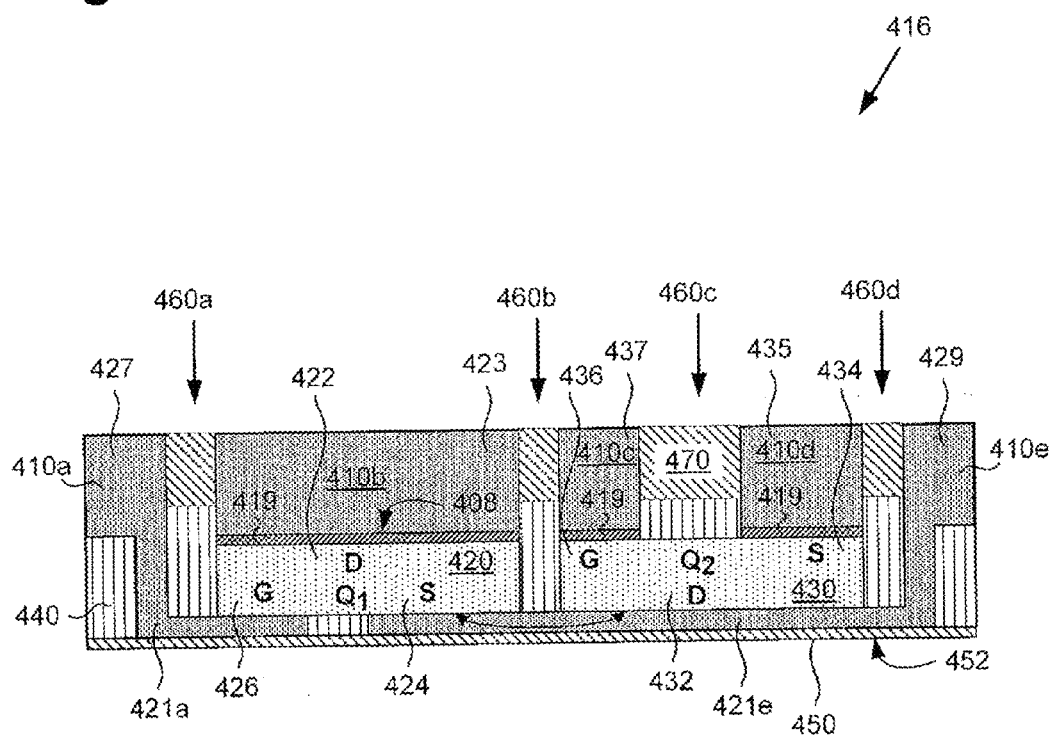
FIG. 4G shows the exemplary structure in FIG. 4F at another intermediate stage of the method described in FIG. 3.

Turning now to structure 416 in FIG. 4G, in some implementations, the method of flowchart 300 may optionally continue with filling of isolation trenches 460*a*-460*d* with insulator 470 (316). In some implementations, as shown in FIG. 4F, isolation trenches 460*a*-460*d* may be sufficient to provide electrical isolation amongst control conductive carrier 410*b*, sync conductive carrier 410*d*, and conductive carrier sections 410*a*, 410*c*, and 410*e* without the need for a dielectric fill. In other implementations, however, it may be necessary, or merely desired, to fill one or more of isolation trenches 460*a*-460*d* with a suitable electrically insulating material. Insulator 470 may be formed of solder resist, for example, and may be deposited or otherwise formed so as to fill one or more of isolation trenches 460*a*-460*d*. Insulator 470 corresponds to insulator 270 in FIG. 2.

Figure 5:
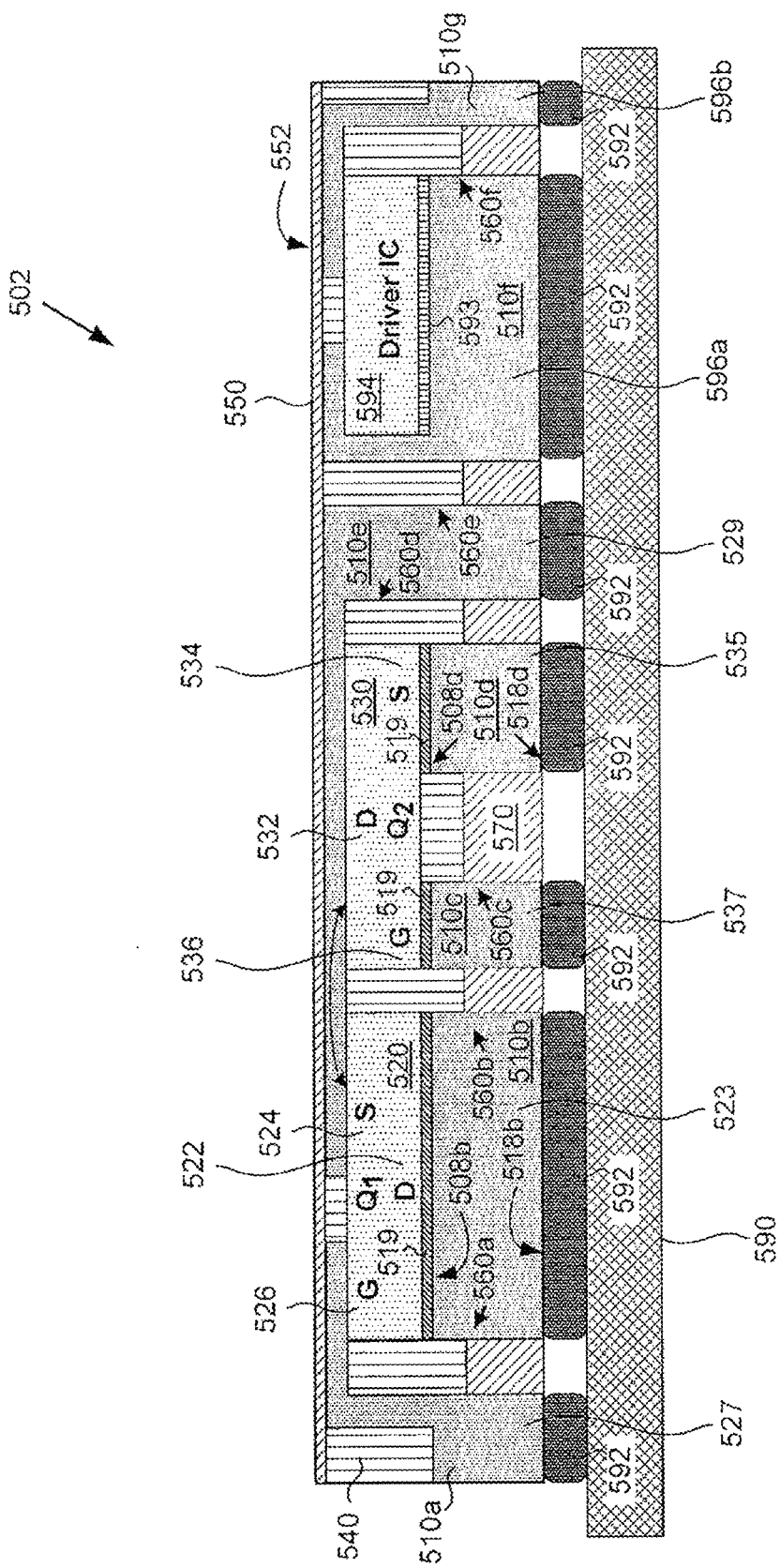
FIG. 5 shows a cross-sectional view of an exemplary semiconductor package with a conductive carrier integrated heat spreader and a driver integrated circuit (IC) for driving one or more power switches of a power converter switching stage, according to one implementation.

Although the implementations shown and described by reference to FIGS. 2, 3, and 4A-4G result in an MCM, such as semiconductor package 201, in FIG. 2, configured to enclose switching stage 101, in FIG. 1, in some applications, it may be desirable to produce a semiconductor package corresponding to MCM 102. An example implementation of such an MCM package is shown by FIG. 5. One of ordinary skill in the art will readily understand that the exemplary method outlined by flowchart 300, in FIG. 3, can be suitably adapted to produce the exemplary MCM package structure shown in FIG. 5.

FIG. 5 shows a cross-sectional view of semiconductor package 502 attached to mounting surface 590, such as a PCB for example, by solder bodies 592. Semiconductor package 502 includes control conductive carrier 510*b* having die side 508*b* and opposite I/O side 518*b* connecting semiconductor package 502 to mounting surface 590. Semiconductor package 502 also includes sync conductive carrier 510*d* having die side 508*d* and opposite I/O side 518*d* also connecting semiconductor package 502 to mounting surface 590.

Semiconductor package 502 further includes control FET 520 ($Q_1$) having control drain 522, control source 524, and control gate 526, as well as sync FET 530 ($Q_2$) having sync drain 532, sync source 534, and sync gate 536. As shown in FIG. 5, control drain 522 of control FET 520 is attached to die side 508*b* of control conductive carrier 510*b*, and sync source 534 of sync FET 530 is attached to die side 508*d* of sync conductive carrier 510*d*. Semiconductor package 502 also includes conductive carrier sections 510*a*, 510*c*, 510*e*, 510*f*, and 510*g*, as well as driver IC 594 for driving at least one of control FET 520 and sync FET 530. In addition, semiconductor package 502 includes electrically conductive die attach material 519, patterned dielectric 540, insulator 570 filling isolation trenches 560*a*, 560*b*, 560*c*, 560*d*, 560*e*, 560*f* (hereinafter "isolation trenches 560*a*-560*f*"), and insulator layer 550 providing surface 552.

Also included as part of semiconductor package 502 are drain contact 523 of control FET 520, source contact, 535 of sync FET 530, gate contacts 527 and 537, switch node contact 529, I/O contacts 596*a* and 596*b* of driver IC 594, and die attach material 593 for attaching driver IC 594 to conductive carrier section 510*f*. It is noted that, depending on the desired implementation, die attach material 593 may be an electrically conductive die attach material or a dielectric die attach material.

Control conductive carrier 510*b*, control FET 520, sync conductive carrier 510*d*, sync FET 530, conductive carrier sections 510*a*, 510*c*, and 510*e*, and electrically conductive die attach material 519 correspond respectively to control conductive carrier 210*b*, Control FET 220, Sync Conductive Carrier 210*d*, Sync FET 230, Conductive Carrier sections 210*a*, 210*c*, and 210*e*, and electrically conductive die attach material 219, in FIG. 2. In addition, patterned dielectric 540, isolation trenches 560*a*-560*d*, insulator 570, contacts 523, 527, 529, 535, and 537, and insulator layer 550, in FIG. 5, correspond respectively to patterned dielectric 240, isolation trenches 260*a*-260*d*, insulator 270, contacts 223, 227, 229, 235, and 237, and insulator layer 250, in FIG. 2. Moreover, it is noted that semiconductor package 502 including driver IC 594, in FIG. 5, corresponds in general to MCM 102 including driver IC 194, in FIG. 1.

According to the implementation shown in FIG. 5, conductive carrier section 510e advantageously provides switch node contact 529 and thereby establishes the electrical connection between control source 524 of control FET 520 and sync drain 532 of sync FET 530. Isolation trenches 560b, 560c, and 560d provide electrical isolation between respective control conductive carrier 510b providing drain contact 523 of control FET 520, conductive carrier section 510c providing gate contact 537 of sync FET 530, sync conductive carrier 510d providing source contact 535 of sync FET 530, and conductive carrier section 510e providing switch node contact 529.

Isolation trench 560e protects driver IC 594 from switching noise that may be present in control conductive carrier 510b, sync conductive carrier 510d, and conductive carrier sections 510a, 510c, and 510e by electrically isolating those conductive carriers from conductive carrier sections 510f and 510g to which driver IC 594 is connected. Moreover, in addition to providing drain contact 523, gate contacts 527 and 537, source contact 535, switch node contact 529, and I/O contacts 596a and 596b, control conductive carrier 510b, sync conductive carrier 510d, and conductive carrier sections 510a, 510c, 510e, 510f, and 510g provide integrated heat spreading by sinking heat produced by control FET 520, sync FET 530, and control IC 594 into mounting surface 590.

Thus, by configuring a conductive carrier utilized as a structural support to provide integrated heat spreading, the packaging solutions disclosed herein advantageously enable a highly compact semiconductor package design, while concurrently providing thermal protection. In addition, by utilizing a conductive carrier to couple a control switch to a sync switch so as to provide a switch node of a power converter switching stage, the present application enables further reductions in package size. Furthermore, use of the conductive carrier to provide the switch node advantageously enables omission of a conductive clip, or any other feature implemented solely or primarily as a switch node electrical connector, from the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for fabricating a semiconductor package, said method comprising:
providing a contiguous conductive carrier having a die side and an opposite input/output (I/O) side;
providing a control FET and a sync FET of a power converter switching stage, said control FET having a control drain and said sync FET having a sync source;
attaching said control drain of said control FET and said sync source of said sync FET to said die side of said contiguous conductive carrier;
forming a control conductive carrier attached to said control drain and a sync conductive carrier attached to said sync source from said contiguous conductive carrier;
said control conductive carrier and said sync conductive carrier configured to sink heat produced, respectively, by said control FET and said sync FET into a mounting surface for said semiconductor package.

2. The method claim 1, wherein said contiguous conductive carrier comprises a lead frame.

3. The method claim 1, wherein said contiguous conductive carrier is pre-patterned.

4. The method claim 1, wherein said control FET and said sync FET comprise silicon FETs.

5. The method claim 1, wherein said control FET and said sync FET comprise III-Nitride FETs.

6. The method claim 1, wherein said power converter switching stage is implemented as part of a buck converter.

7. A method for fabricating a semiconductor package, said method comprising:
providing a contiguous conductive carrier having a die side and an input/output (I/O) side;
providing a control FET and a sync FET, said control FET having a control drain and said sync FET having a sync source;
attaching said control drain of said control FET and said sync source of said sync FET to said die side of said contiguous conductive carrier;
forming a control conductive carrier attached to said control drain;
said control conductive carrier configured to sink heat produced by said control FET into a mounting surface for said semiconductor package.

8. The method claim 7, wherein said contiguous conductive carrier comprises a lead frame.

9. The method claim 7, wherein said contiguous conductive carrier is pre-patterned.

10. The method claim 7, wherein said control FET and said sync FET comprise silicon FETs.

11. The method claim 7, wherein said control FET and said sync FET comprise III-Nitride FETs.

12. The method claim 7, wherein said control FET and said sync FET are part of a power converter switching stage.

13. The method claim 12, wherein said power converter switching stage is part of a buck converter.

14. A method for fabricating a semiconductor package, said method comprising:
providing a contiguous conductive carrier having a die side and an input/output (I/O) side;
providing a control FET and a sync FET, said control FET having a control drain and said sync FET having a sync source;
attaching said control drain of said control FET and said sync source of said sync FET to said die side of said contiguous conductive carrier;
forming a sync conductive carrier attached to said sync source;
said sync conductive carrier configured to sink heat produced by said sync FET into a mounting surface for said semiconductor package.

15. The method claim 14, wherein said contiguous conductive carrier comprises a lead frame.

16. The method claim 14, wherein said contiguous conductive carrier is pre-patterned.

17. The method claim 14, wherein said control FET and said sync FET comprise silicon FETs.

18. The method claim 14, wherein said control FET and said sync FET comprise M-Nitride FETs.

19. The method claim 14, wherein said control FET and said sync FET are part of a power converter switching stage.

20. The method claim 19, wherein said power converter switching stage is part of a buck converter.

* * * * *